United States Patent
Ohba et al.

(10) Patent No.: US 7,352,308 B2
(45) Date of Patent: Apr. 1, 2008

(54) DC OFFSET CORRECTION DEVICE AND METHOD

(75) Inventors: Takeshi Ohba, Kawasaki (JP);
Yasuhito Funyu, Kawasaki (JP);
Hideharu Shako, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/407,768

(22) Filed: Apr. 20, 2006

(65) Prior Publication Data

US 2007/0176806 A1    Aug. 2, 2007

(30) Foreign Application Priority Data

Jan. 31, 2006    (JP)    .............. 2006-022009

(51) Int. Cl.
*H03M 1/06*    (2006.01)
(52) U.S. Cl. ..................... 341/118; 341/120
(58) Field of Classification Search ............. 341/118, 341/119, 143, 120
See application file for complete search history.

(56) References Cited

U.S. PATENT DOCUMENTS

| | | | |
|---|---|---|---|
| 5,903,823 A | | 5/1999 | Moriyama et al. |
| 6,005,506 A | * | 12/1999 | Bazarjani et al. ............ 341/143 |
| 2002/0018531 A1 | * | 2/2002 | Ratto .......................... 375/297 |
| 2002/0115416 A1 | | 8/2002 | Riou et al. |
| 2004/0032913 A1 | | 2/2004 | Dinur |
| 2004/0252782 A1 | | 12/2004 | Demir et al. |
| 2005/0169402 A1 | | 8/2005 | Niwa et al. |
| 2005/0258989 A1 | * | 11/2005 | Li et al. ..................... 341/120 |

FOREIGN PATENT DOCUMENTS

| | | |
|---|---|---|
| EP | 1 271 815 | 1/2003 |
| JP | 9-83587 | 3/1997 |
| JP | 2005-217911 | 8/2005 |
| WO | 2005/025168 | 3/2005 |

OTHER PUBLICATIONS

European Search Report dated Jun. 22, 2006.

* cited by examiner

*Primary Examiner*—Jean B Jeanglaude
(74) *Attorney, Agent, or Firm*—Katten Muchin Rosenman LLP

(57) ABSTRACT

It is an object of the present invention to provide a DC offset correction means capable of correctly performing DC offset correction even when transmitting a non-modulation signal in radio communication equipment for performing orthogonal modulation by a direct RF modulation method. The DC offset correction device comprises a fixed value setting unit for setting a value for outputting a non-modulation signal with a specific phase from a modulator, a non-modulation signal switch unit for switching between a main signal and the value set by the fixed value setting unit and a DC offset correction control unit for sequentially changing the specific phase of the non-modulation signal outputted from the modulator by sequentially changing the value set by the fixed value setting unit and operating a DC offset correction value to be added to an input signal by a DC offset correction unit, based on feedback signal data generated from the non-modulation signal whose phase is sequentially changed.

9 Claims, 11 Drawing Sheets

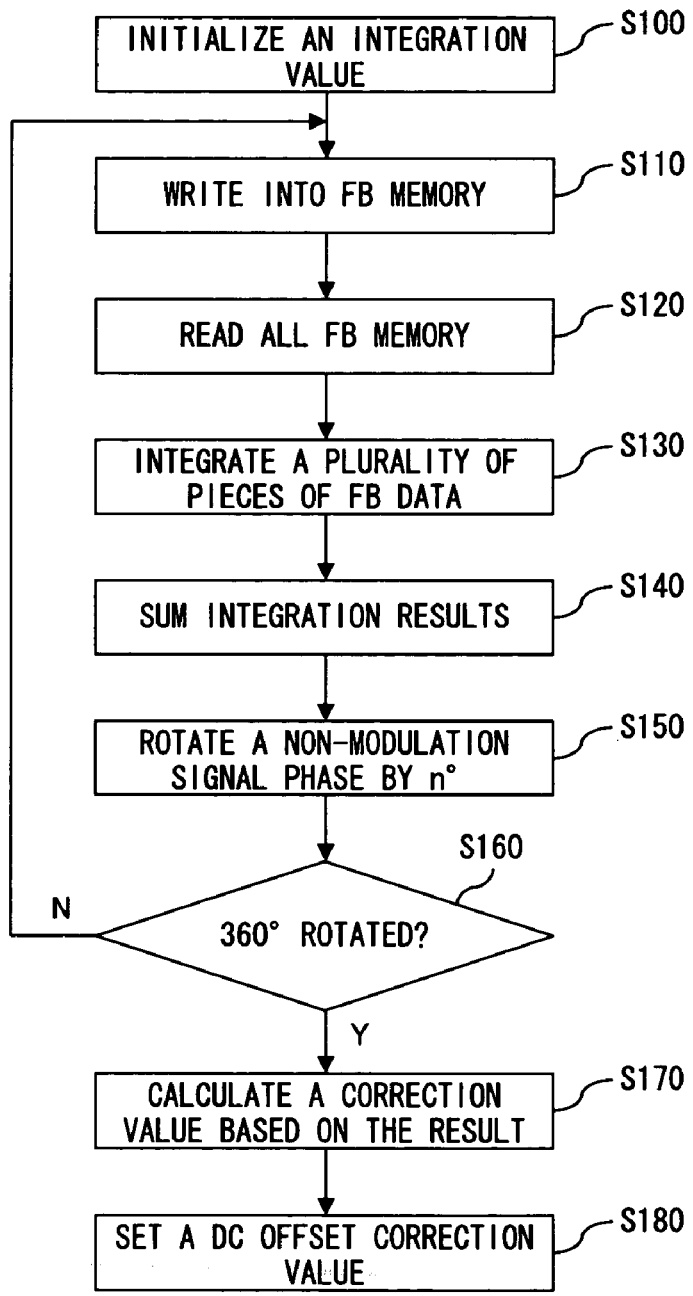
F I G. 6A

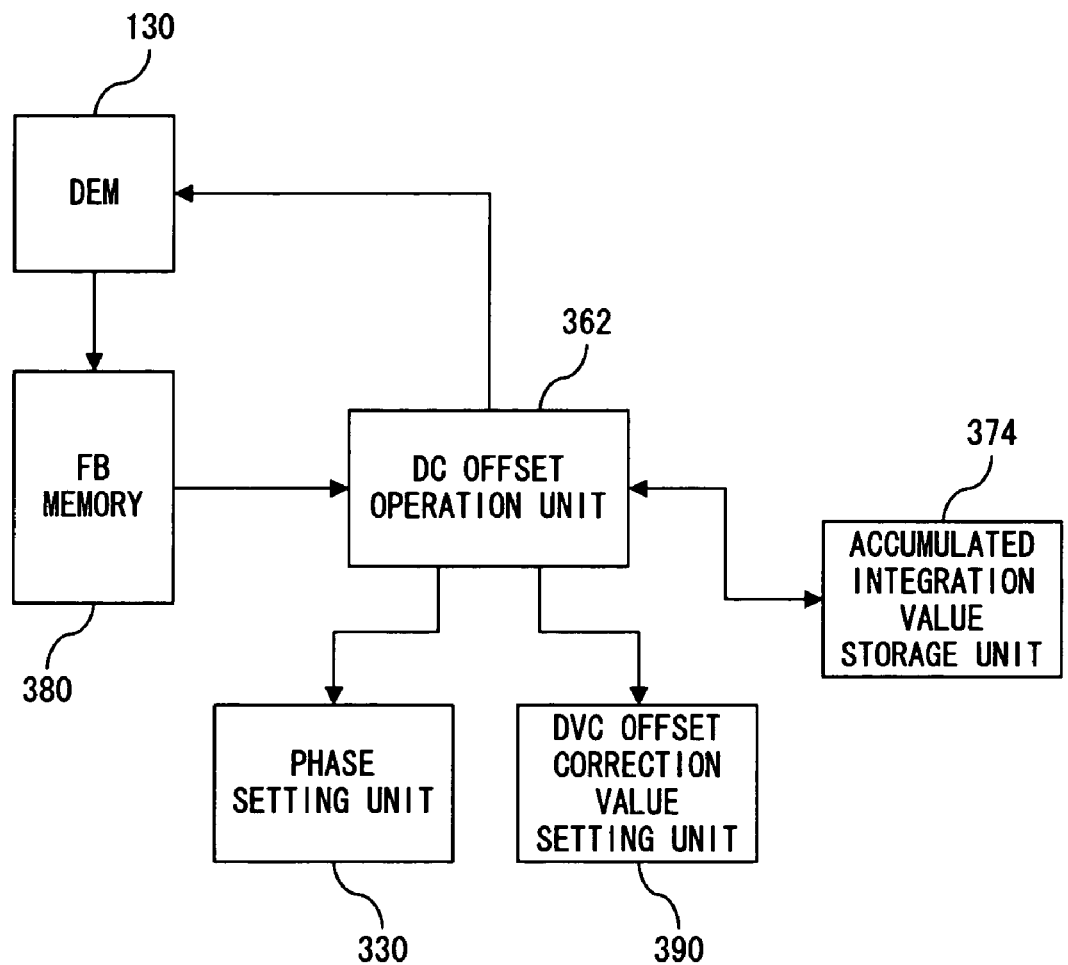
F I G. 6 B

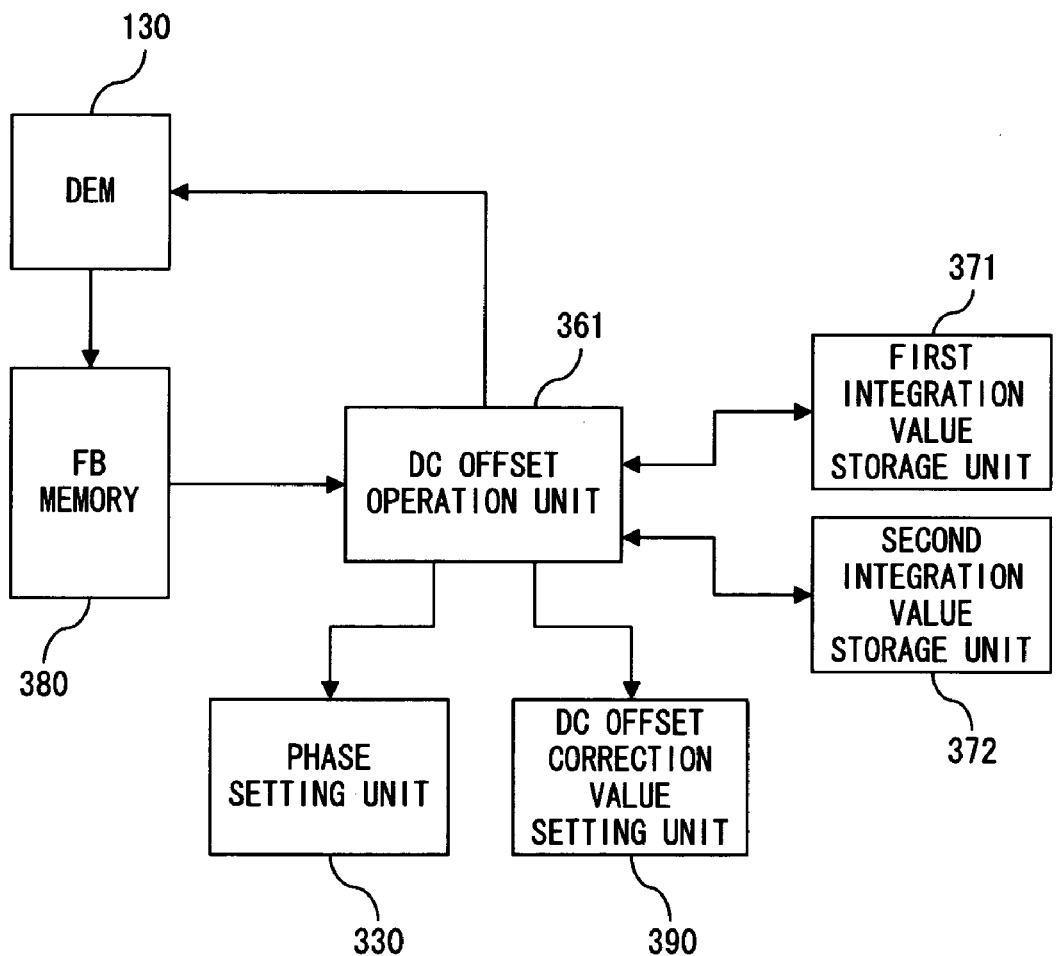
F I G. 7 B

DC OFFSET CORRECTION DEVICE AND METHOD

BACKGROUND OF THE INVENTION

1. Field of the Invention

The present invention relates to a device for correcting DC components generated by an orthogonal modulator or the like in radio communication equipment and a method thereof.

2. Description of the Related Art

Recently, in radio communication equipment, an orthogonal modulation for generating modulated signals as a product sum of two signals which are orthogonal to each other of a carrier wave signal and an input signal (I and Q channels) has become used in order to effectively utilize a frequency or so. A direct RF modulation method for directly modulating base-band signals to RF signals without passing them through an intermediate frequency has been adopted in order to miniaturize a transmitting unit.

In radio communication equipment adopting the direct RF modulation method for such orthogonal modulation, it is known that DC components (DC offset) are generated in a D/A converter or a modulator and carrier leak (local leak) is externally outputted. Since this local leak is an unwanted wave, in order to realize communication with good quality, the local leak must be reduced. In order to reduce this local leak, a DC offset correction circuit for realizing a function to give an offset voltage so as to cancel the DC offset generated in a modulator or the like is needed. Since the amount of DC offset of the modulator or the like changes depending on temperature and the amplitude of I and Q signals to be inputted, it is preferable to update the parameter of the DC offset correction circuit and adaptively cancel the DC offset even when the radio communication equipment is operated. Thus, a device for reducing local leak even when temperature and IQ amplitude values change, by a CPU provided for the radio communication equipment calculating DC components using reference signal data or feedback signal data and adaptively updating the parameter of the DC offset correction device is realized.

As the conventional DC offset correction method, two methods are known.

One method receives transmitting signals by a feedback loop in the radio communication equipment, extracts DC offset components only by this feedback signal and corrects the DC offset by a transmitting unit, based on the extracted DC offset components. The correction by this method is called feedback type DC offset correction or feedback signal integration type DC offset correction.

The other method extracts DC offset components from the difference between the feedback signal and transmitting signal and corrects them by a transmitting unit. The correction by this method is called reference signal type DC offset correction or signal comparison type DC offset correction.

FIG. 1 shows an example of the configuration of the transmitting unit of a direct RF modulation radio communication device with a DC offset correction function. FIG. 1 shows the configuration corresponding to the two correction methods. The routes of I and Q channel signals are collectively shown.

According to the configuration example shown in FIG. 1, a transmitting signal inputted to the transmitting unit is inputted to a DC offset correction unit (10) and when adopting the reference signal type DC offset correction, is also stored in a memory circuit 2 (90) via a delay circuit (91) as a reference signal (Ref signal). In the DC offset correction unit (10), a DC offset correction process is applied to the transmitting signal inputted there by the DC offset correction control of a CPU (60) based on data stored in a memory circuit 1(80) or the memory circuit 1 (80) and memory circuit 2 (90). The transmitting signal to which the DC offset correction process is applied is inputted to a DA converter (20), is converted from a digital signal to an analog signal by the DA converter (20) and is inputted to an orthogonal modulator (30). The orthogonal modulator (30) generates a modulation wave from the transmitting signal converted into an analog signal and an RF band carrier signal which is the output of a first local oscillator (51) and outputs it to a main amplifier (40). The main amplifier (40) amplifies the modulation wave. The amplified modulation wave is externally outputted, also is fed back to the transmitting unit and is inputted to one input port of a mixer (31).

To the other input port of the mixer (31), the output of a second local oscillator (52) is inputted. The output of the mixer (31) can be obtained by converting the modulation wave into a base-band signal. The base-band signal is converted from an analog signal into a digital signal by an AD converter (120). The digital signal is inputted to a demodulation unit (130) together with the output of a numerical control oscillator (70) whose phase can be adjusted by the CPU (60), is demodulated and is stored in the memory circuit 1 (80) as feedback signal data.

In the feedback type DC offset correction method, a CPU (60) consecutively reads feedback signal data stored in the memory circuit 1 (80) to integrate them, surmises the direction of the DC offset vector based on the integration value and set the parameter for giving appropriate amplitude in the inverse direction, thereby canceling DC offset.

In the reference signal type DC offset correction method, a feedback signal obtained by demodulating the output of the main amplifier (40) to base-band IQ signals via a feedback route and a reference signal which is a base-band signal before modulation are used. DC offset is removed by subtracting the reference signal from the feedback signal, calculating a phase-reversed parameter using an error signal obtained by extracting the DC offset component of the transmitting signal and updating the parameter of the DC offset correction unit (10) Prior to this operation, the phase of the numerical value control oscillator (70) must be adjusted in order to correctly calculating the error signal, the phases of the feedback signal and reference signal must be adjusted and the signal point phases of the reference and feedback signals must be matched.

The details of the above-described DC offset correction method are disclosed in the following patent reference 1.

In this case, although these DC offset corrections are made in order to correct carrier components which appear in a modulation frequency, a transmitting device sometimes transmits a CW signal (non-modulation signal) for frequency check as a part of device test.

If the same frequency as the modulation frequency is transmitted to test when this test CW signal is transmitted, in the case of the feedback type DC offset correction, the DC offset component appearing in a feedback signal and the CW signal component cannot be distinguished and DC offset correction is not satisfactorily made.

FIG. 2 explains the above-described case using a signal vector on an IQ plane.

As shown in FIG. 2, the sum of a DC offset vector which should be "0" made by correction and a CW signal vector which should be transmitted becomes a transmitting signal vector. In the case of the feedback type DC offset correction, this transmitting signal vector is attempted to correct.

In the case of the reference signal type DC offset correction, if the influence of the DC offset component is great, a correct correction value cannot be obtained. This is because a correct phase cannot be obtained since as described above, the phase of the numerical oscillator (70) in the feedback loop is matched to the phase of the DC offset component for phase adjustment.

FIGS. 3A and 3B show the above-described situation. FIG. 3A shows a case where the DC offset component is small. As shown in FIG. 3A, the CW signal vector indicated by a dotted line coincides with the feedback signal vector. Therefore, in this case, by matching the phase of the feedback signal to that of the reference signal by phase adjustment, a DC offset can be correctly calculated.

FIG. 3B shows a case where the DC offset component is large. As shown in FIG. 3B, the CW signal vector indicated by a dotted line is the difference between the feedback signal vector and the DC offset vector being the carrier component. Therefore, in this case, a wrong phase is calculated by phase adjustment and a correct DC offset cannot be calculated.

Patent reference 1: International Publication No. WO2005/025168 A1

SUMMARY OF THE INVENTION

It is an object of the present invention to provide a DC offset correction means capable of correctly correcting a DC offset even when transmitting non-modulation signal.

According to the present invention, in order to solve the problem, when radio communication equipment for adopting a direct RF modulation method for orthogonal modulation transmits non-modulation signals, it transmits the non-modulation signals while sequentially changing their phases, integrates the feedback signals of the non-modulation signals transmitted while sequentially changing their phases and corrects the DC offset by the integration value of the integrated feedback signals.

Thus, according to the present invention, the DC offset correction device comprises a fixed value setting unit for setting a value to output a non-modulation signal with a specific phase from a modulator, a nonmodulation signal switch unit for switching between a main signal and the value set by the fixed value setting unit and outputting it and a DC offset correction unit for sequentially changing the specific phase of the non-modulation signal outputted from the modulator by sequentially changing the value set by the fixed value setting unit and calculating a DC offset correction value which the DC offset correction unit adds to an input signal, based on the sum value of feedback signal data generated from the non-modulation signal whose phase is sequentially changed.

According to the present invention, the vectors of the non-modulation signals are cancelled by each other and the vector of only the DC offset component can be calculated. Therefore, correct DC offset correction can be made by using this vector value.

BRIEF DESCRIPTION OF THE DRAWINGS

FIG. 6A explains the first process flow of implementing the method shown in FIG. 5.

FIG. 6B shows an example of the functional configuration for executing the first process flow shown in FIG. 6A.

FIG. 7B shows an example of the functional configuration for executing the second process flow shown in FIG. 7A.

DESCRIPTION OF THE PREFERRED EMBODIMENTS

Figure 4:
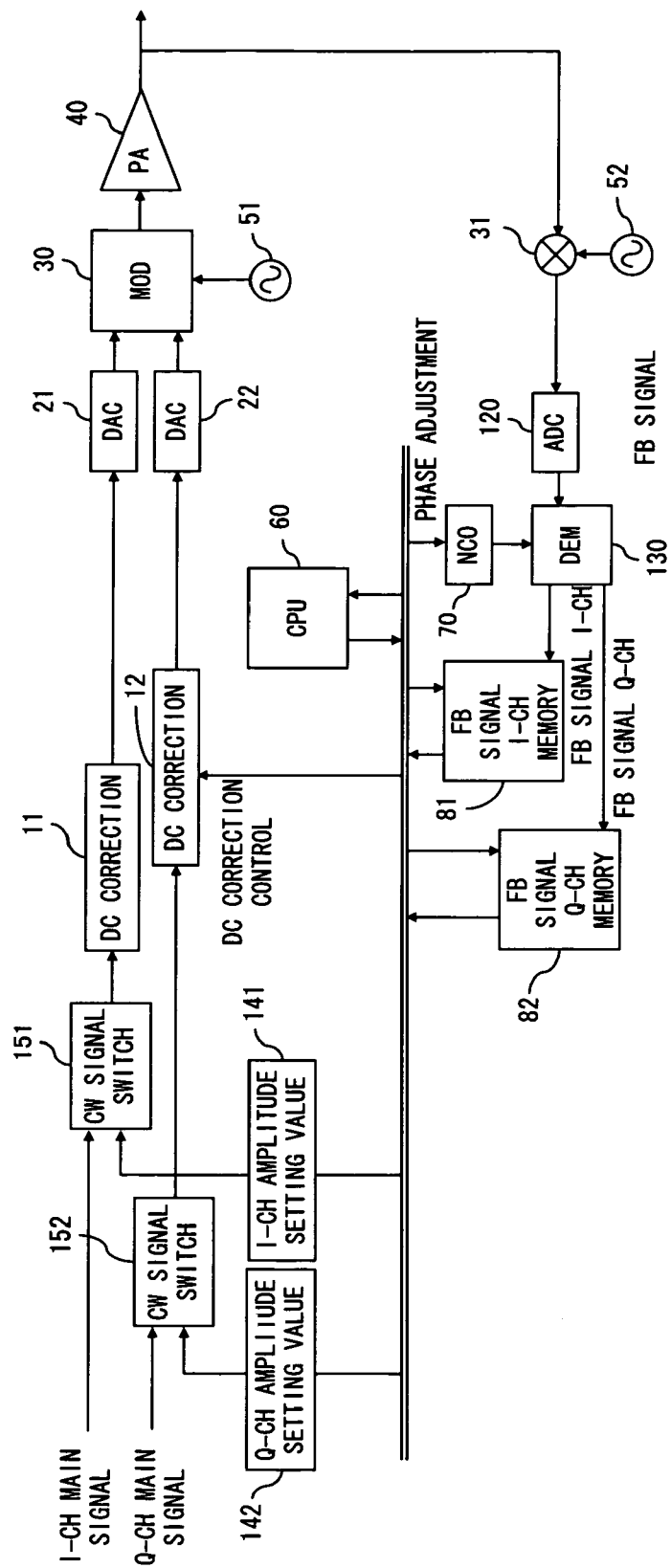
FIG. 4 shows an example of the first configuration of the transmitting unit of the radio communication equipment of the present invention.

FIG. 4 shows an example of the first configuration of the transmitting unit of the radio communication equipment of the present invention. In this configuration, non-modulation signal switch units (151 and 152), an I-channel amplitude value setting unit (141) and a Q-channel amplitude value setting unit (142) are added to the conventional one shown in FIG. 1. In this configuration, components are divided for I and Q channels and are described. Components for making the reference signal type DC offset correction are not described since they are not related to the present invention.

As clearly described later, the I-channel amplitude value setting unit (141) and the Q-channel amplitude value setting unit (142) correspond to the fixed value setting unit of the present invention, and a CPU (60) corresponds to the DC offset correction control unit.

The operations of the components shown in FIG. 4 are described below.

Figure 1:
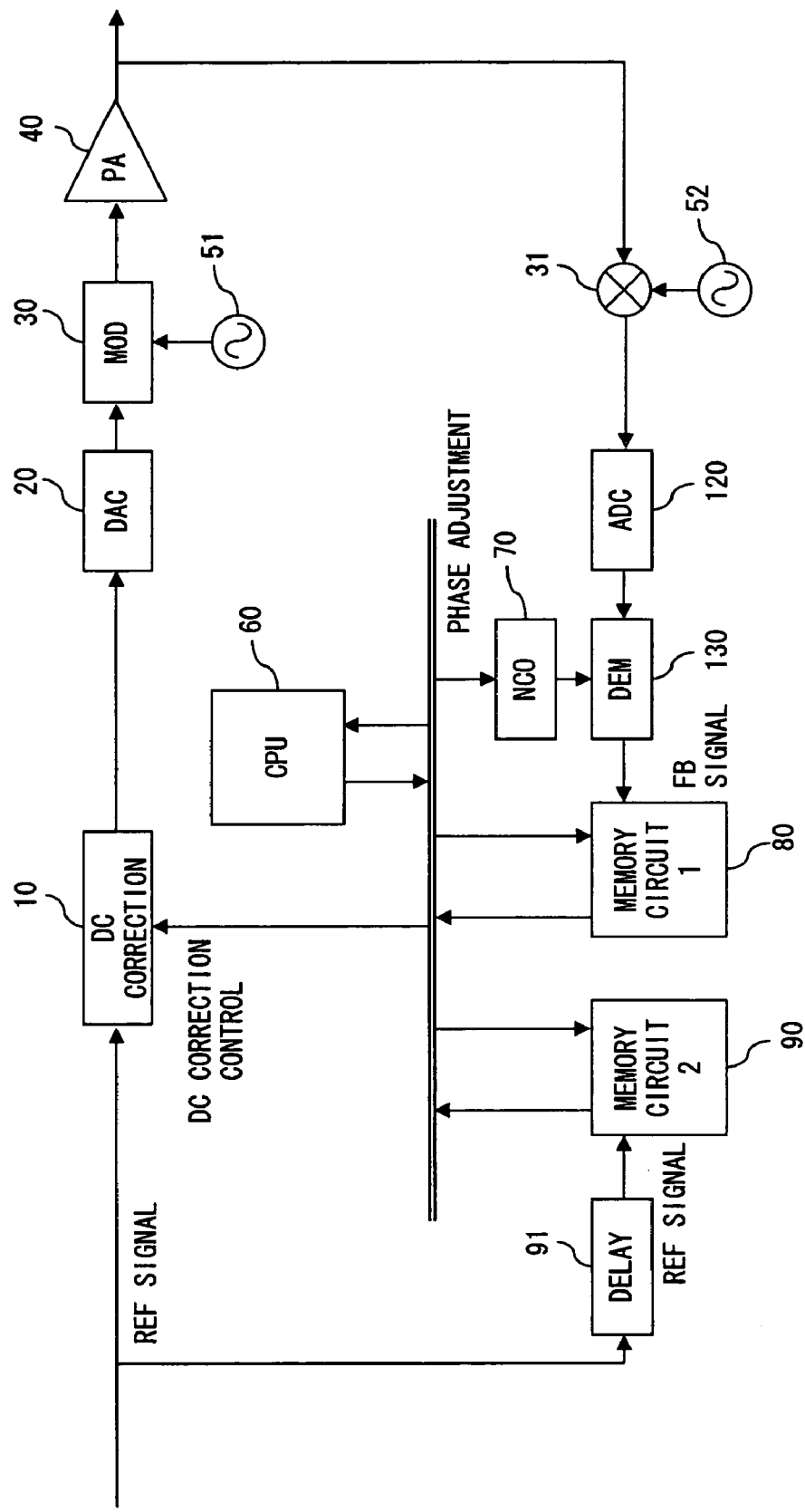
FIG. 1 shows an example of the configuration of the transmitting unit of a conventional radio communication device.
Figure 2:
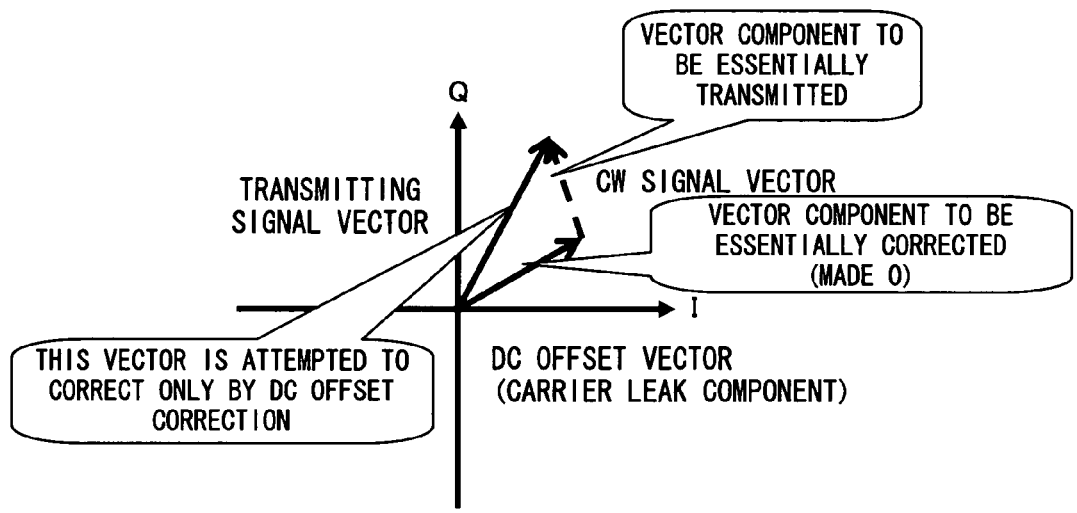
FIG. 2 explains the problem of a conventional feedback type DC offset correction at the time of transmitting a non-modulation signal.
Figure 3A:
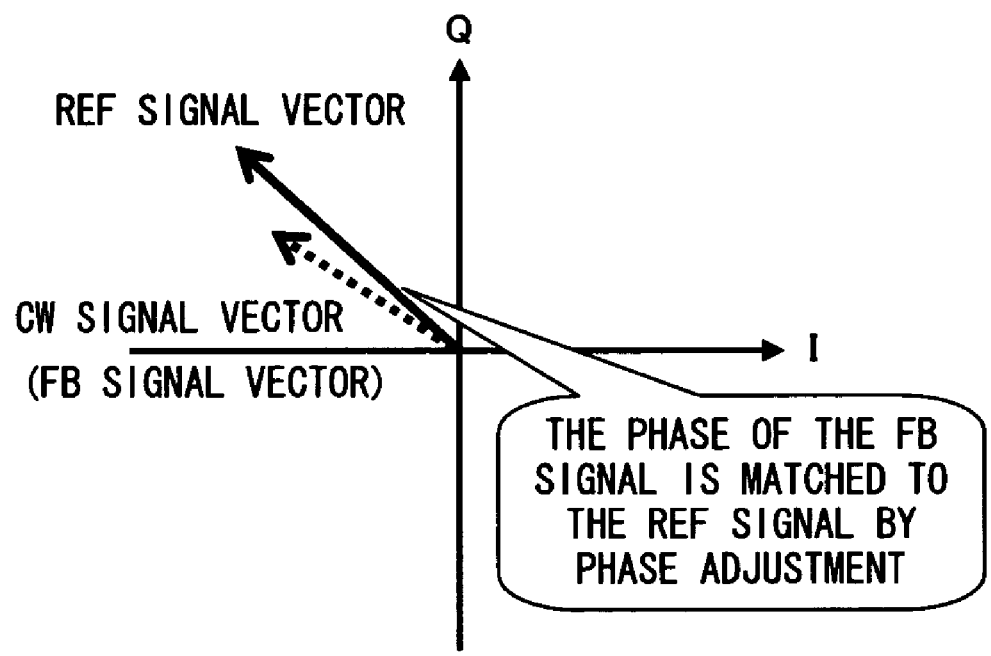
FIG. 3A explains a case where a conventional reference signal type DC offset correction is correctly made at the time of transmitting a non-modulation signal.
Figure 3B:
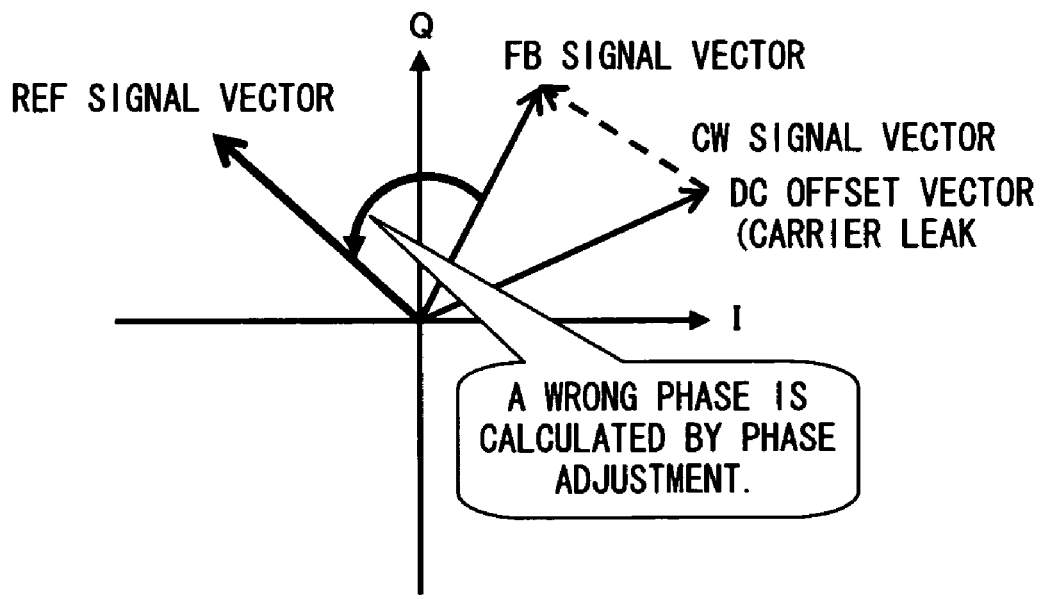
FIG. 3B explains a case where a conventional reference signal type DC offset correction is not correctly made at the time of transmitting a non-modulation signal.

The operations of transmitting I- and Q-channel main signals are the same as those shown in FIG. 1.

When transmitting a non-modulation signal, the non-modulation signal switch units (151 and 152) are switched to the I-channel amplitude value setting unit (141) and Q-channel amplitude value setting unit (142) sides, respectively. Then, non-modulation carrier frequency signals each with a phase corresponding to each ratio of amplitude values are generated by an orthogonal modulator (30) and non-modulation signals each with a specific phase are transmitted from a main amplifier (40).

The CPU (60) sequentially changes the setting values of the I-channel amplitude value setting unit (141) and Q-channel amplitude value setting unit (142). As a person having ordinary skill in the art clearly knows, by sequentially changing the setting values of the I-channel amplitude value setting unit (141) and Q-channel amplitude value setting unit (142), the phases of non-modulation signals transmitted from the main amplifier (40) can be sequentially changed. Then, by storing the feedback signal data of the non-modulation signals each with a specific phase in a feedback signal I-channel memory (81) and a feedback signal Q-channel memory (82) and integrating the data respectively, a transmitting signal vector being the sum of the CW signal vector and DC offset vector at the phase can be obtained.

Therefore, by calculating the sum of transmitting signal vectors obtained by sequentially changing the phase of the non-modulation signal by 360 degrees, for one rotation, a CW signal vector can be cancelled and a DC offset vector can be obtained.

Figure 5:
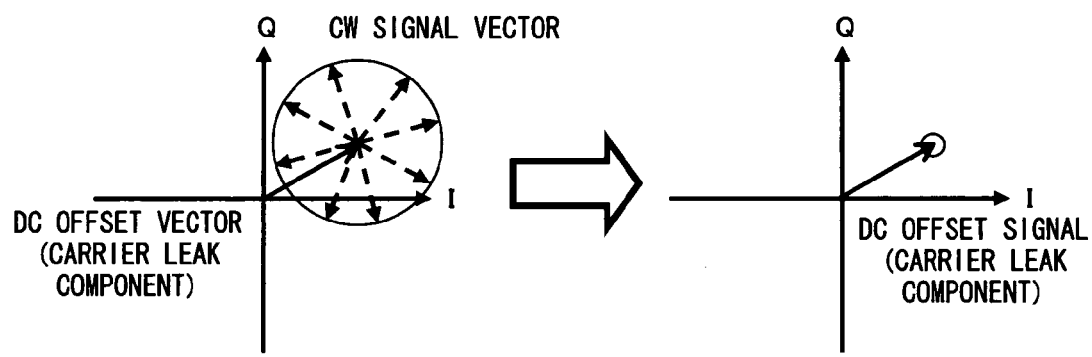
FIG. 5 explains a method for calculating a DC offset vector by the phase rotation of a non-modulation signal in the present invention.

FIG. 5 shows a method for obtaining DC offset vector by the phase rotation of non-modulation signal in the present invention.

In FIG. 5, the phase of a non-modulation signal is rotated by 45 degrees every time and eight CW vectors are obtained. If these eight CW vectors are summed, as shown on the right side of FIG. 5, the CW vectors are cancelled by each other and a DC offset vector can be obtained.

As clearly shown in FIG. 5, the phase of the non-modulation signal is rotated in such a way that the sum of CW vectors corresponding to respective phases may become zero. Therefore, there is no need to always rotate the phase by the same angle every time. It can also be rotated by 180 degrees only once.

FIG. 6A explains the first process flow of implementing the method shown in FIG. 5. FIG. 6B shows an example of the functional configuration for executing the first process flow shown in FIG. 6A. The processes described in FIG. 6A are performed by a DC offset operation unit (362) described in FIG. 6B.

An example of the process of the present invention is described below with reference to FIGS. 6A and 6B.

In step S100 of FIG. 6A, the DC offset operation unit (362) described in FIG. 6B initializes an integration value stored in an accumulated integration value storage unit (374). Then, in step S110, a demodulation unit (130) is instructed to write demodulated feedback signal data into a feedback memory (380).

After the data is written into the feedback memory (380), in step S120 all pieces of the written feedback signal data is read from the feedback memory (380) and in step S130 the read feedback signal data is integrated. Then, in step S140 the integrated value is added to the value stored in the accumulated integration value storage unit (374).

The feedback signal data written into the feedback memory corresponds to the direction of a transmitting signal vector at that time. Therefore, although the times of writing can be theoretically once, in the case of a plurality of times its operation can be more stable.

Then, in step S150 a setting value for rotating the phase of a non-modulation signal by n degrees which is a predetermined angle of one integral order of 360 degrees is set in a phase setting unit (330).

Then, in step S160 it is determined whether the phase has been rotated by a necessary degree. Although "360° rotated→" is shown in FIG. 6A, this easily indicates whether the phase has been rotated by a necessary degree. In the flow of FIG. 6A, since the phase is rotated in step S150 after steps S110 through S140, speaking accurately in software logic, it is determined whether the phase has been rotated by (360−n) degrees. Alternatively, the phase can be also rotated prior to step S110. In that case, it is determined whether the phase has been rotated by 360 degrees.

If the determination is no in step S160, the processes in steps S110 and after are repeated. If it is yes, the flow proceeds to step S170. In step S170 a correction value is calculated based on the result obtained in step S140 and in step S180 the value is set in the DC offset correction value setting unit (390).

The DC offset operation unit (362) shown in FIG. 6B can be realized by a CPU (60) shown in FIG. 4 and a program on the CPU (60). Although the accumulated integration value storage unit (374) can also be externally provided like the feedback memory (380), it is preferable to realize it by a register in the CPU (60). Although a phase setting unit (330) can be realized by the I-channel amplitude value setting unit (130) and Q-channel amplitude value setting unit (140) shown in FIG. 4, it can be also realized by the register in the CPU (60) and an amplitude value can also be transferred from the register to the I-channel amplitude value setting unit (130) and Q-channel amplitude value setting unit (140). The DC offset correction value setting unit (390) can be provided for the DC offset correction units (11 and 12) shown in FIG. 4 or be realized by the register in the CPU (60).

The demodulation unit (130) is the same as shown in FIG. 4. The feedback memory (380) corresponds to the feedback signal I-channel memory (81) and the feedback signal Q-channel memory (82) which are shown in FIG. 4.

Although terms "integration" and an "integration value" are used in FIGS. 6A and 6B, these correspond to sum and a summed result, respectively, since they are integration of digital values.

The above-described correspondence also applies to FIGS. 7A and 7B, which are described below.

Next, another example of the process of the present invention is described.

Figure 7A:
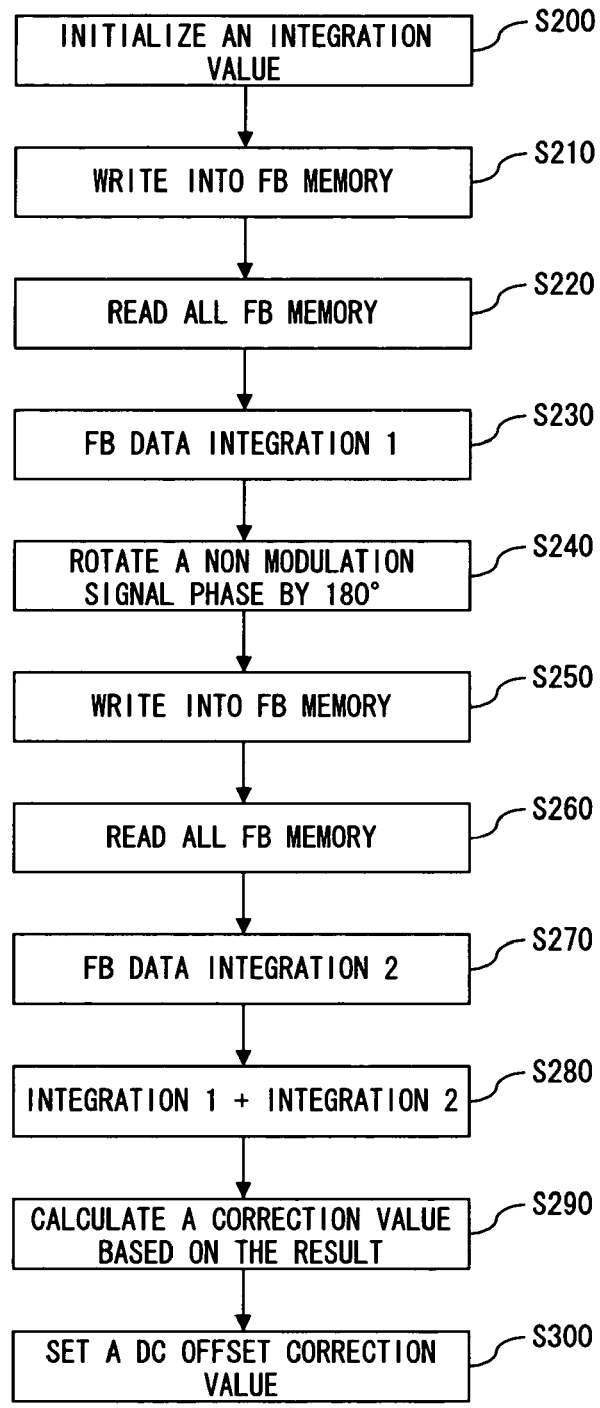
FIG. 7A explains the second process flow of implementing the method shown in FIG. 5.

FIG. 7A explains the second process flow of implementing the method shown in FIG. 5. FIG. 7B shows an example of the functional configuration for executing the second process flow shown in FIG. 7A.

In step S200 of FIG. 7A the DC offset operation unit (361) shown in FIG. 7B initializes an integration value stored in the first integration value storage unit (371) and the second integration value storage unit (372). Then, in step S210 the demodulation unit (130) is instructed to write demodulated feedback signal data into the feedback memory (380).

After the data is written into the feedback memory (380), in step S220 all pieces of the written feedback signal data are read from the feedback memory (380) and in step S230 the read feedback signal data is integrated and the integrated value is stored in the first integration value storage unit (371).

Then, in step S240 a setting value for rotating the phase of a non-modulation signal by 180 degrees is set in the phase setting unit (330).

Then, in step S250 the demodulation unit (130) is instructed again to write demodulated feedback signal data in the feedback memory (380).

After the data is written into the feedback memory (380), in step S260 all pieces of the written feedback signal data are read from the feedback memory (380) and in step S270 the read feedback signal data is integrated and the integrated value is stored in the second integration value storage unit (372).

Then, in step S280 the values stored in the first integration value storage unit (371) and the second integration value storage unit (372) are summed. Then, in step S290 a correction value is calculated based on the result obtained in step S280 and in step S300 the value is set in the DC offset correction value setting unit (390).

In the second process flow, since the phase of a non-modulation signal is rapidly changed in step S240, its output waveform instantaneously falls into disorder. Therefore, it can be applied only in the case where the radio communication equipment has no problem. However, in the first process flow, since the phase of the non-modulation signal is slowly rotated digitally to reduce the discontinuous component of the waveform as much as possible, there is no waveform disorder.

Therefore, there is also a variation in which the phase is gradually rotated by up to 180 degrees as in the first process flow and lastly their values are integrated so as to prevent an output waveform from falling into disorder in the second process flow.

Next, the second configuration of the transmitting unit of the radio communication equipment of the present invention is described with reference to FIG. 8.

Figure 8:
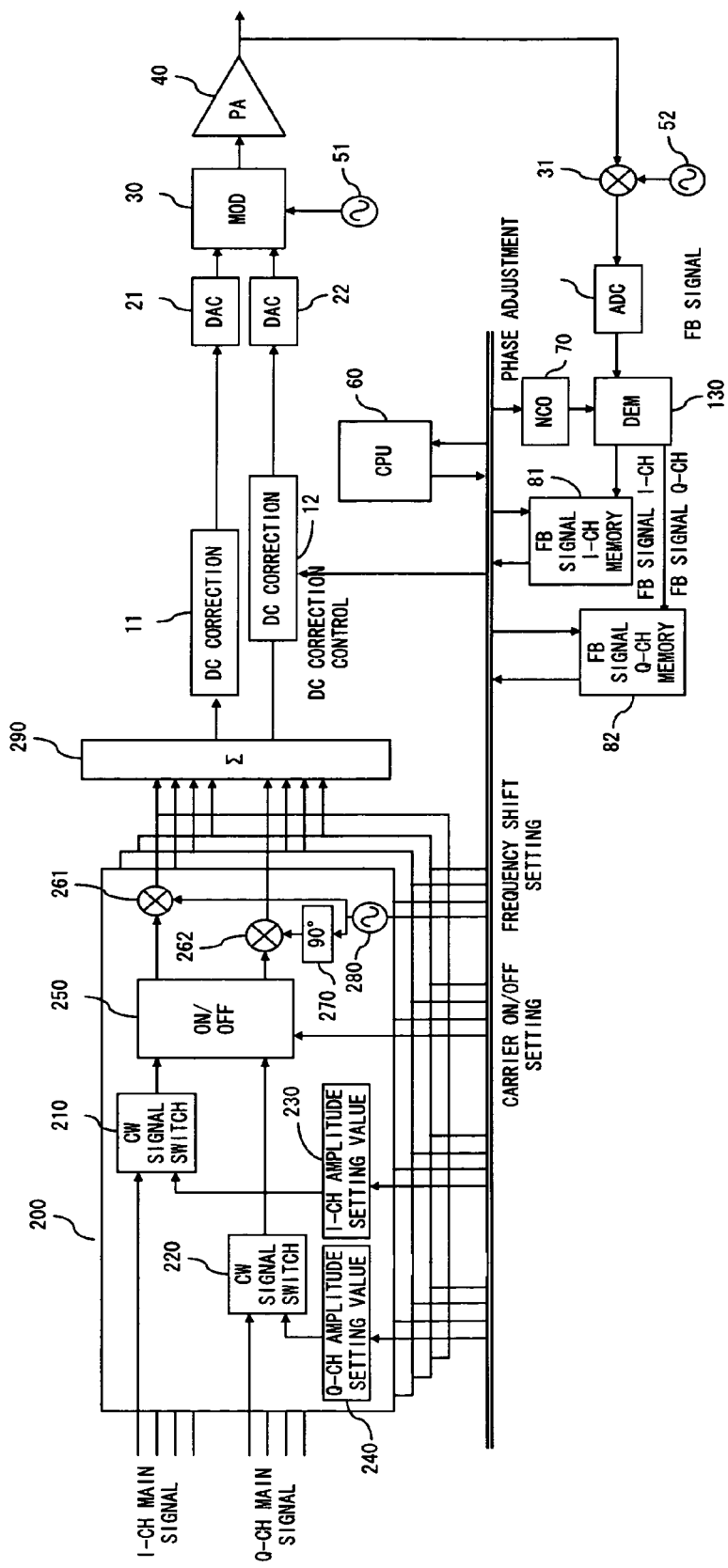
FIG. 8 shows an example of the second configuration of the transmitting unit of the radio communication equipment of the present invention.

The radio communication equipment shown in FIG. 8 adopts a frequency multiplexing method, and the fixed value setting unit and a non-modulation signal switch unit of the present invention are provided for each carrier unit for frequency multiplexing.

In FIG. 8, four carrier units are provided and a carrier unit (200) is typically shown together with its internal configuration.

The carrier unit (200) comprises non-modulation signal switch units (210 and 220) for switching between an I-channel main signal and the setting value of an I-channel amplitude value setting unit (230) and between a Q-channel main signal and the setting value of a Q-channel amplitude value setting unit (240) respectively, an on/off unit (250) for switching on/off a carrier whose on/off is set and a frequency shift unit. The frequency shift unit comprises an I-channel mixer (261), a Q-channel mixer (262), a 90° phase shifter (270) and a frequency shift oscillator (280).

The outputs of the I-channel mixer (261) and Q-channel mixer (262) are inputted to a combiner (290) and each output is combined with a signal from another carrier unit.

An operation after the I-channel main signal output and Q-channel main signal output of the combiner (290) are inputted to the DC offset correction units (11 and 12) is the same as that described before with reference to FIG. 4. The CPU (60) can change the phase of a non-modulation signal by changing the respective setting values of the I-channel amplitude value setting unit (230) and Q-channel amplitude value setting unit (240) and calculate a DC offset vector by integrating a plurality of pieces of feedback signal data to cancel CW signal vectors by each other.

Therefore, a value for accurately correcting DC offset can be obtained.

As clearly shown from the above detailed description, a program executed by the CPU (60) in order to realize the offset correction of the present invention is included as one aspect of the present invention. A storage medium for storing the program is also clearly included as one aspect of the present invention.

What is claimed is:

1. A feedback type DC offset correction method of radio communication equipment for performing orthogonal modulation by a direct RE modulation method when the radio communication equipment transmits a non-modulation signal, comprising:
    transmitting the non-modulation signal after changing its phase sequentially;
    integrating feedback signals of the non-modulation signal transmitted after changing the phase; and
    correcting DC offset by an integration value of the integrated feedback signals.

2. The DC offset correction method according to claim 1, wherein the non-modulation signal is transmitted after its phase is changed by a predetermined angle of one integer order of 360 degrees.

3. A DC offset correction device which applies a feedback type DC offset correction to radio communication equipment for performing orthogonal modulation by a direct RF modulation method and which comprises a DC offset correction unit for adding a DC offset correction value to its input signal and outputting it to an orthogonal modulator side, comprising:
    a fixed value setting unit for setting a value for outputting a non-modulation signal with a specific phase from the modulator;
    a non-modulation signal switch unit for switching between a main signal and the value set by the fixed value setting unit and outputting it; and
    a DC offset correction control unit for sequentially changing the specific phase of the non-modulation signal outputted from the modulator by sequentially changing the value set by the fixed value setting unit and operating the DC offset correction value to be added to the input signal by the DC offset correction unit, based on the summed value of a plurality of pieces of feedback signal data generated from the non-modulation signal whose phase has been sequentially changed.

4. The DC offset correction device according to claim 3, wherein the radio communication equipment adopts a frequency multiplexing method and comprises the fixed value setting unit and non-modulation signal switch unit for each carrier of the frequency multiplexing method.

5. The DC offset correction device according to claim 3, wherein the DC offset correction control unit sequentially changes the value set by the fixed value setting unit in such a way as to sequentially change the phase of the non-modulation signal by a predetermined angle of one integer order of 360 degrees every time.

6. The DC offset correction device according to claim 3, wherein the fixed value setting unit comprises an I-channel signal amplitude value setting unit and a Q-channel signal amplitude value setting unit and the DC offset correction control unit makes a specific phase of the phase of the non-modulation signal by setting an I-channel signal amplitude value and a Q-channel signal amplitude value in the I-channel signal amplitude value setting unit and the Q-channel signal amplitude value setting unit, respectively.

7. A computer-readable storage medium on which is recorded a DC offset correction program for enabling a computer for the feedback type DC offset correction device according to claim 3 to execute a DC offset correction control process, comprising steps of:
    initializing an accumulated integration value storage unit for storing a sum of a plurality of pieces of the feedback signal data;
    instructing a demodulation unit for generating feedback data, based on the non-modulation signal to write feedback signal data in feedback memory;
    reading the plurality of pieces of feedback signal data stored in the feedback memory and summing them;
    reading the value stored in the accumulated integration value storage unit and storing a sum of the read value and the sum in the accumulated integration value storage unit;
    setting a value for rotating a phase of a non-modulation signal currently being transmitted by n degrees being a predetermined angle of one integer order of 360 degrees in a phase setting unit;
    determining whether the phase of the non-modulation signal has been rotated by (360−n) degrees from the initial phase and branching it into the write instruction step if it has not been rotated; and reading the value stored in the accumulated integration value storage unit and calculating a DC offset correction value based on the value.

8. A computer-readable storage medium on which is recorded a DC offset correction program for enabling a computer for the feedback type DC offset correction device according to claim 3 to execute a DC offset correction control process, comprising steps of:

initializing a first integration value storage unit and a second integration value storage unit which store the sum of the plurality of pieces of feedback signal data;

instructing a demodulation unit for generating feedback data, based on the non-modulation signal to write feedback signal data in feedback memory;

reading the plurality of pieces of feedback signal data stored in the feedback memory and summing them;

storing the sum in the first integration value storage unit;

setting a value for rotating a phase of a non-modulation signal currently being transmitted by 180 degrees in a phase setting unit;

instructing the demodulation unit to write the feedback signal data onto the feedback memory again;

reading the plurality of pieces of feedback signal data stored in the feedback memory and summing them;

storing the sum in the second integration value storage unit; summing the values stored in the first integration value storage unit and the second integration value storage unit; and calculating a DC offset correction value, based on the obtained sum.

9. A computer-readable storage medium on which is recorded a DC offset correction program for enabling a computer for the feedback type DC offset correction device according to claim 3 to execute a DC offset correction control process, comprising steps of:

initializing a first integration value storage unit and a second integration value storage unit which store the sum of the plurality of pieces of feedback signal data;

instructing a demodulation unit for generating feedback data, based on the non-modulation signal to write feedback signal data in feedback memory;

reading the plurality of pieces of feedback signal data stored in the feedback memory and summing them;

storing the sum in the first integration value storage unit;

sequentially setting a value for gradually rotating a phase of a non-modulation signal currently being transmitted up to 180 degrees in a phase setting unit;

instructing the demodulation unit to write the feedback signal data onto the feedback memory again;

reading the plurality of pieces of feedback signal data stored in the feedback memory and summing them;

storing the sum in the second integration value storage unit;

summing the values stored in the first integration value storage unit and the second integration value storage unit; and calculating a DC offset correction value, based on the obtained sum.

* * * * *